(12) United States Patent
Perez-Willard

(10) Patent No.: US 8,415,644 B2
(45) Date of Patent: Apr. 9, 2013

(54) PROCESSING SYSTEM

(75) Inventor: Fabian Perez-Willard, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/451,734

(22) Filed: Apr. 20, 2012

(65) Prior Publication Data

US 2012/0267545 A1   Oct. 25, 2012

(30) Foreign Application Priority Data

Apr. 21, 2011   (DE) .......................... 10 2011 018 460

(51) Int. Cl.
*H01J 37/305*   (2006.01)

(52) U.S. Cl.
USPC ................... 250/492.1; 250/492.2; 250/492.3

(58) Field of Classification Search ..... 250/492.1–492.3
See application file for complete search history.

(56) References Cited

U.S. PATENT DOCUMENTS

| | | | |
|---|---|---|---|
| 5,055,696 A | 10/1991 | Haraichi et al. | |
| 5,851,413 A | 12/1998 | Caella et al. | |
| 2005/0103272 A1 | 5/2005 | Koops et al. | |
| 2007/0246651 A1* | 10/2007 | Koike et al. | 250/310 |
| 2008/0302954 A1* | 12/2008 | Phaneuf et al. | 250/251 |
| 2009/0152460 A1 | 6/2009 | Buhler et al. | |
| 2010/0051828 A1 | 3/2010 | Doemer et al. | |
| 2010/0102223 A1 | 4/2010 | Albiez et al. | |

FOREIGN PATENT DOCUMENTS

| | | |
|---|---|---|
| DE | 102 08 043 A1 | 9/2003 |
| DE | 10 2007 054 074 A1 | 5/2009 |
| DE | 10 2008 040 426 A1 | 2/2010 |
| DE | 10 2008 045 336 A1 | 3/2010 |
| EP | 2 091 066 A2 | 8/2009 |

OTHER PUBLICATIONS

Extended European search report for corresponding EP Appl No. 12 002 787.5, dated Jul. 26, 2012.
German Office action, with English translation, for corresponding DE Application No. 10 2011 018 460.0, dated Dec. 13, 2011.

* cited by examiner

*Primary Examiner* — Michael Maskell
(74) *Attorney, Agent, or Firm* — Fish & Richardson P.C.

(57) ABSTRACT

A processing system includes a piping which extends annularly, such as in the form of a circular annular shape, around a beam path between a focusing lens and an interaction region. The piping includes, on a side which faces the interaction region, a plurality of exit openings for the gas towards the interaction region. The piping also includes a holder configured to pivot the piping about a pivot axis. The holder is parallel to the tilt axis of the object holder.

20 Claims, 3 Drawing Sheets

PROCESSING SYSTEM

CROSS-REFERENCE TO RELATED APPLICATION

The application claims priority under 35 U.S.C. §119 to German Patent Application No. 10 2011 018 460.0, filed Apr. 21, 2011, the entire contents of which are hereby incorporated by reference.

FIELD

The disclosure relates to a processing system which includes a particle beam column having a focusing lens to direct a particle beam onto an interaction region of an object and a gas supply arrangement to supply a gas to the interaction region. The gas which is supplied to the interaction region may neutralize a space charge at the object. The space charge may be caused by the impingement of the particle beam onto the object. The gas may be activated by the particle beam and cause material deposition or material ablation in the interaction region.

BACKGROUND

There are known configurations of gas supply arrangements which are integrated in a particle beam column. Examples of such configurations are disclosed in U.S. Pat. No. 5,055,696, EP 2 091 066 A2, DE 102 08 043 A1, DE 10 2008 040 426 A1, DE 10 2007 054 074 A1, and US 2007/0246651 A1.

A configuration which includes a particle beam column and a gas supply arrangement can include a second particle beam column. The second particle beam column may direct a second particle beam to an interaction region. For such configurations, it may be desirable for the object to be tiltable relative to both particle beam columns. This, for example, can allow to selectively direct either the first or the second particle beam perpendicular to a surface of the object.

Commonly known configurations of integrated particle beam columns and gas supply arrangements can exhibit the disadvantages of being inflexible, and/or not permitting at the same time a small distance of the focusing lens of the particle beam column from the object and tilting the object. They also may have a negative influence on a symmetry of electric or magnetic fields of the focusing lens in the region of the object surface. Thereby, these configurations can have a detrimental effect on the quality of the particle beam in the interaction region or on the gas supply to the interaction region.

SUMMARY

The disclosure provides a processing system which allows integration of a gas supply arrangement with a particle beam column such that certain disadvantages can be at least partially mitigated.

According to an embodiment, a processing system includes a first particle beam column having a focusing lens for directing a first particle beam along a beam path of the first particle beam onto an interaction region. The interaction region may be defined as a focus region or an object region of the first particle beam and/or the second particle beam. The object region may be defined as a region, where a portion of the object is arranged for processing of the portion. The processing system may further include an object holder for arranging an object in the interaction region, wherein the object holder is configured to tilt the object relative to the first particle beam column about a tilting axis, wherein the tilting axis is oriented perpendicular or transverse to the direction of the particle beam. The processing system may further include a gas supply arrangement, which includes an annular piping and a gas supply line. One end of the gas supply line may be coupleable to a gas reservoir. The gas supply line opens into the annular piping at a further end of the gas supply line. In other words, the gas supply line may be coupled to the annular piping at the further end of the gas supply line. Thereby, gas may be supplied from the gas reservoir into the annular piping.

The annular piping extends annularly around the beam path of the first and/or a second particle beam. In other words, the annular piping may form a single closed loop surrounding the first and/or second particle beam. In particular, the annular piping may extend in the form of a circular annular shape around the beam path of the first particle beam and/or a second particular beam. The pivot axis of the annular piping may be aligned with or located within a principal plane of the annular piping. The principal plane of the annular piping may intersect the annular piping. The principal plane may divide the annular piping into two halves of substantially equal size. A longitudinal axis of a channel of the annular piping may be aligned with or located within the principal plane.

The annular piping may be arranged between the focusing lens and the interaction region. On a side of the annular piping, which faces the interaction region, a plurality of exit openings are provided for the gas towards the interaction region. The plurality of exit openings may be arranged such that a gas flow of the gas is produced, wherein at least a portion of the gas flow is directed towards the interaction region when leaving the annular piping. Additionally or alternatively the gas exit openings may be arranged on an object side relative to a principal plane of the annular piping. Additionally or alternatively, the plurality of exit openings may face the interaction region and/or may be oriented towards the interaction region.

The annular piping may include a holder, which is configured to pivot the annular piping about a pivot axis, which is parallel to a tilting axis of the object holder. The holder may be arranged at the gas supply line, the annular piping and/or a linear section of the gas supply line. The holder may be configured to pivotably support the gas supply line, the annular piping and/or the linear section of the gas supply line. The pivot axis of the annular piping may be arranged at a distance from the tilt axis of the object holder. The pivot axis may be arranged along or arranged parallel to a longitudinal axis of the gas supply line or a longitudinal axis of a linear section of the gas supply line.

Thereby, it is possible to pivot the angular piping of the gas supply arrangement when the object holder is being tilted relative to the particle beam column, such that a collision of the object with the gas supply arrangement is avoided even at small distances between the object and the gas supply arrangement. In particular, at each of a plurality of different tilt positions of the object holder, the annular piping may be orientable along a same orientation as the object. For example, the annular piping may extend parallel to a plane object surface, wherein this is possible for each of a plurality of different tilt positions of the object holder. This allows to provide at a plurality of different tilt positions of the object relative to the particle beam column, substantially constant configurations of electric and magnetic fields of the focusing lens, such that a focusing or a focus of the particle beam in the interaction region is largely independent from the tilt position of the object relative to the particle beam column. Also, parameters for supplying the gas may be largely independent from the tilt position of the object relative to the particle beam column.

The annular piping may be supported or carried by the gas supply line. In addition to the gas supply line, no further structures may be provided, which support the annular piping or which are connected to the annular piping. A longitudinal axis of the gas supply line may be aligned with or located within the principal plane of the annular piping.

The gas supply line may further include a linear section, which extends linearly. In particular, the linear section may extend along or parallel to the pivot axis. The linear section may include a straight longitudinal axis. The pivot axis may be arranged within a cross section of the gas supply line or within a cross section of the linear section of the gas supply line. The pivot axis may pass through a center of the cross section or through a portion of the cross section, which is located closest to the object among all portions within the cross section.

According to an embodiment, the plurality of exit openings are be equally distributed, as seen along a circumferential direction of the annular piping. The openings may be arranged at equal distances or at substantially equal distances along the circumferential direction or along a perimeter of the annular piping.

The exit openings may be gas exit openings for supplying gas to the interaction region on the object. For example, two, three, four or more exit openings, such as six, ten or even more exit openings may be provided. A number of exit openings may be less than 500 or less than 100. The exit openings may for example have a circular cross section or may be formed as slits, which extend along the circumferential direction of the annular piping or along a full perimeter of the annular piping. In particular, the plurality of exit openings, which are distributed along the circumferential direction, may also be in a form of one single annular opening, which continuously extends along a circumferential direction. The single annular opening may extend around the full perimeter of the annular piping.

In practice, an inner diameter of the ring, i.e. a distance between opposite side walls of the annular piping, which face each other and which also face the beam path may be chosen as small as possible for enabling an arrangement of the exit opening close to the interaction region. The inner diameter may further be chosen as big as desired to allow one or more particle beams to pass through the ring towards the interaction region and also to allow a scanning of the one or more particle beams over a sufficiently large portion of the object. In some embodiments, the particle beam, which is directed onto the interaction region is deflected away from a symmetry axis or an optical axis of the focusing lens for scanning the beam, for example over the object.

The pivot axis of the annular piping may coincide with the tilt axis of the object holder. In other words, the pivot axis of the annular piping may extend along the tilt axis of the object holder. According to embodiments, the pivot axis of the annular piping has a distance from the tilt axis of the object holder of more than 0.25 mm or of more than 1.0 mm. In particular, this distance may be selected such that it is equal to the distance between a surface of the object and the surface or area of the annular piping, which faces the object. The pivot axis of the annular piping may be oriented parallel to the tilt axis of the object holder.

BRIEF DESCRIPTION OF THE DRAWINGS

The forgoing as well as other advantageous features will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
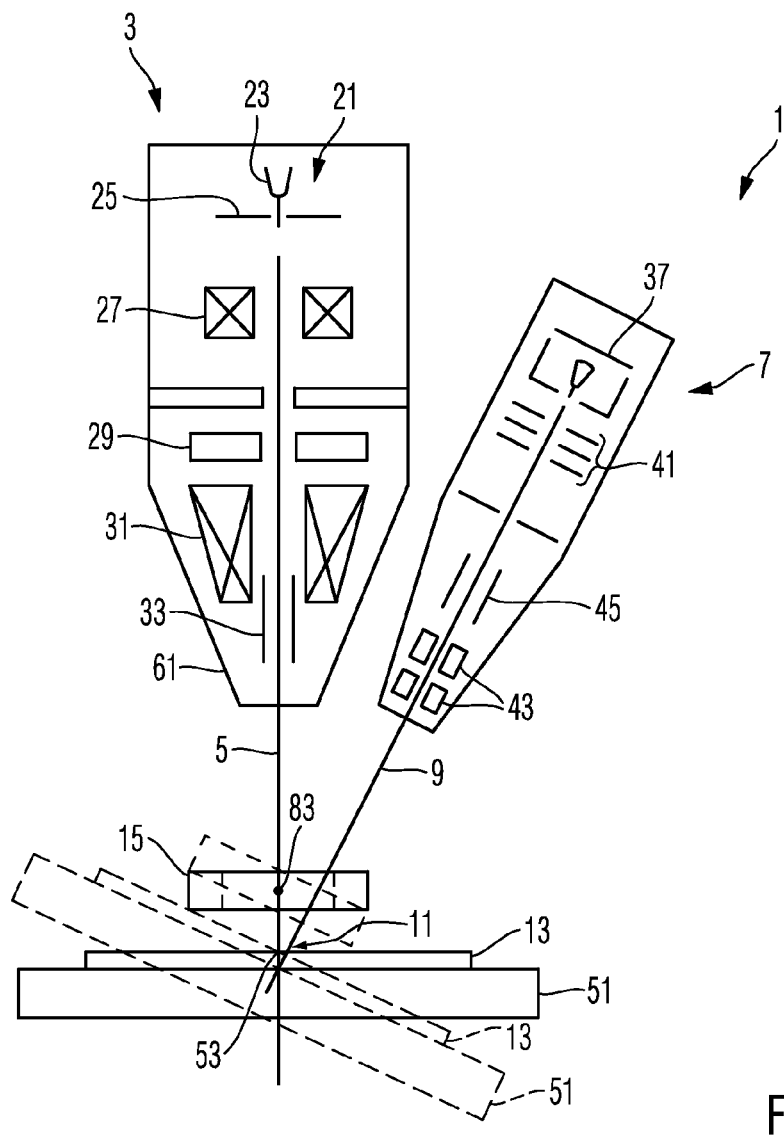
FIG. 1 is a schematic illustration of a processing system according to an exemplary embodiment.

In the exemplary embodiments described below, components that are alike in function and structure are designated as far as possible by alike reference numerals. Therefore, to understand the features of the individual components of a specific embodiment, the descriptions of other embodiments and of the summary should be referred to.

FIG. 1 is a schematic illustration of an exemplary embodiment of a processing system 1. The processing system 1 includes two particle beam columns. The two particle beam columns include an electron beam column 3 to generate an electron beam 5 and an ion beam column 7 to generate an ion beam 9. Each of the beams is directed to an interaction region 11. In the interaction region 11, a surface of an object 13 to be processed is arranged. The object 13 to be processed may for example be a semiconductor wafer 13.

The processing of the object 13 may include, for example, operating the electron beam column 3 as an electron microscope to generate an electron microscopical image of the portion of the object which is arranged in the interaction region. To this end, the electron beam 5 is directed as a primary beam onto the object 13 for generating secondary particles, such as back-scattered electrons and secondary electrons. The back-scattered electrons and/or secondary electrons are detected by one or more detectors, such as an electron detector, to generate an electron microscopic image.

The electron beam 5, which is directed onto the surface of the object 13, may cause a local electrical charging on the object surface. In some applications, it is desirable to reduce such a charging. To this end, a gas supply arrangement 15 is provided. With the gas supply arrangement 15, it is possible to supply to the interaction region 11 a gas, such as nitrogen, oxygen, air and/or water vapor. The gas may be ionized by the electron beam. The ionized gas may neutralize charges, which are located on the object surface.

The processing of the object 13 may further be performed with the ion beam column 7. The ion beam column 7 may be used to deposit or ablate material in the interaction region 11 of the object 13.

The ablation of material may be caused by the ion beam 9 impinging on the object 13 and removing single atoms or groups of atoms from the object 13. In many cases, the ablation of material is performed by using a process gas, such as xenon difluoride, iodine, chlorine or water vapor. The process gas is supplied to the interaction region and is excited by the ion beam. The process gas establishes chemical bonds with atoms or molecules of the object 13 and removes the atoms or molecules from the object 13. The process gas may also be supplied via the gas supply arrangement 15 to the interaction region 11.

The process gas may be supplied to the interaction region and activated by the ion beam such that decomposition products of molecules of the process gas are deposited at the object, thereby depositing the material on the object. Examples of such process gases are tungsten hexacarbonyl, phenanthrene, silan compounds, dimethylacetylacetonategold and methylcyclopentadienyltrimethylplatinum. Also, the supply of such a process gas may be performed with the gas supply arrangement 15.

Furthermore, it is possible to use ions of the ion beam 9 as primary particles to acquire an image of the object 13 in the interaction region 11, wherein the ions remove secondary particles from the object, such as further ions and electrons, which then are detected. Additionally or alternatively, it is possible, to excite a process gas in the interaction region 11 with the electron beam 5 for performing a deposition of material on the object or an ablation of material from the object.

The electron beam column 3 includes an electron source 21 having a cathode 23 and an anode 25, one or more condenser lenses 27 for generating the electron beam 5. The electron beam column 3 also includes an electron detector 29, which, in the illustrated example, is arranged within the electron beam column. The electron beam column 3 further includes an objective lens 31 for directing and/or focusing the electron beam 5 onto the interaction region 11. The electron detector 29 is configured to detect secondary electrons and/or back-scattered electrons for acquiring an electron microscopic image of the object portion in the interaction region 11. In the illustrated example, the electron detector 29 is arranged within the electron beam column 3. However, it is also conceivable that the electron detector 29 is arranged outside of the electron beam column 3. The electron detector 29 is arranged such that electrons, which emanate from the interaction region 11 are detectable.

The electron beam column 3 further includes a beam deflector 33 for varying an impingement location of the electron beam 5 on the object within the interaction region 11. In particular, by operating the beam deflector 33, it is possible to schematically scan the electron beam 5 over the surface of the object 13 and to simultaneously detect secondary electrons and/or back-scattered electrons with the electron detector 29 for acquiring an electron microscopic image of the object.

The ion beam column 7 includes an ion source 37 and electrodes 41 for forming and accelerating the ion beam 9. The ion beam column 7 also includes focusing coils or focusing electrodes 43 for focusing the ion beam 9 within the interaction region 11. The ion beam column 7 further includes a beam deflector 45 for varying an impingement location of the ion beam 9 on the object 13 within the interaction region 11.

The object 13 is held by an object holder 51, such that a portion of the surface of the object 13 is arranged in the interaction region 11. The object holder 51 is further configured to tilt the object 13 about a tilt axis 53, which is oriented perpendicular to the drawing plane of FIG. 1, such that the object is arrangeable at a plurality of tilt positions relative to the electron beam column 3 and the ion beam column 7, respectively. In the tilt position of the object 13 and the object holder 51, which is illustrated in FIG. 1 with unbroken lines, the surface of the object 13 is oriented relative to the electron beam column 3 such that the electron beam 5 impinges substantially perpendicular onto the surface of the object. The ion beam 9, which is oriented at an angle of, for example, 40° to 60° relative to the electron beam 5 then impinges obliquely onto the surface of the object 13. According to an embodiment, the angle between the ion beam 9 and the electron beam 5 is 54°. However, it is also conceivable, that this angle is significantly greater than 60°. According to a further possible embodiment, this angle amounts to 90°.

In the tilt position of the object 13 and the object holder 51, which is illustrated in FIG. 1 in dashed lines, the object is arranged relative to the ion beam column 7 such that the ion beam 9 impinges substantially perpendicularly onto the surface of the object 13, whereas the electron beam 5 impinges obliquely onto the surface.

The tilting of the object relative to the particle beam columns 3, 7 is desirable for forming and inspecting three-dimensional structures on the object. For example, a hole which extends perpendicularly or vertically into the object, can be prepared by irradiating the object with the ion beam 9 in the tilt position, which is illustrated in FIG. 1 in dashed lines. In the tilt position, which is illustrated in FIG. 1 in unbroken lines, the hole can be inspected with the electron beam.

A configuration of the gas supply arrangement 15 is described in the following with reference to FIGS. 2 to 5.

Figure 2:
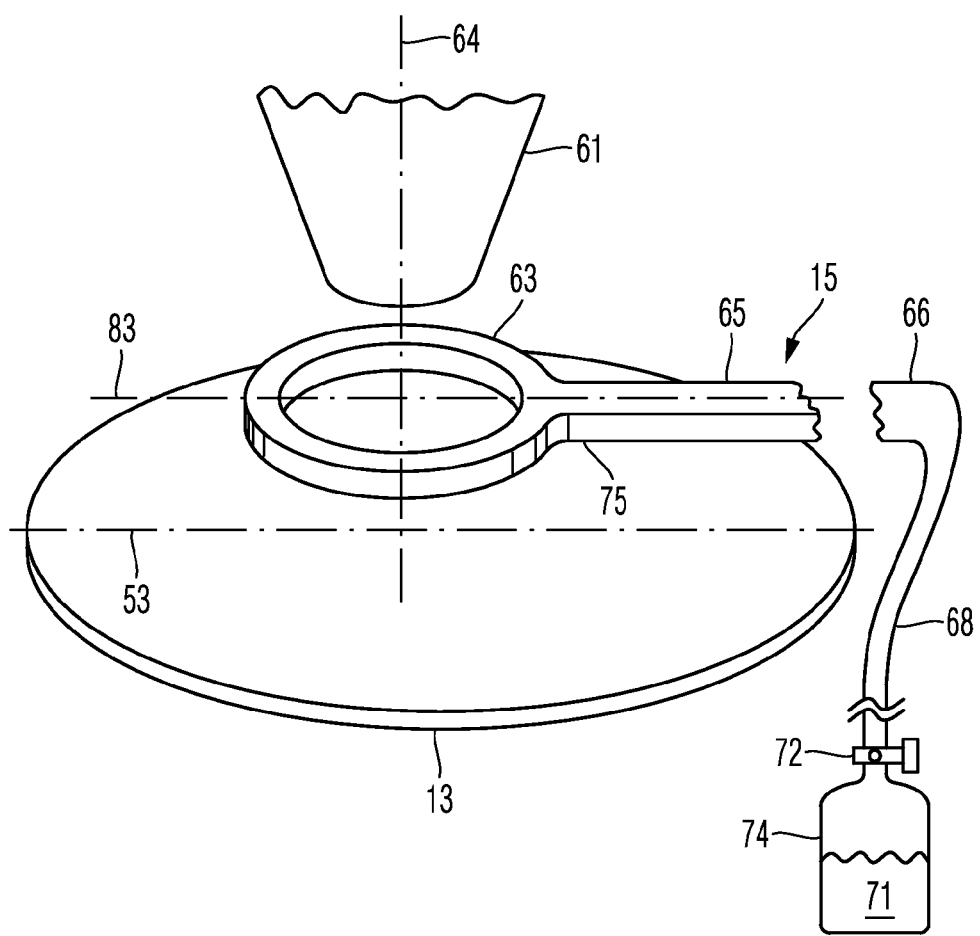
FIG. 2 is a perspective view of a portion of the processing system shown in FIG. 1.

FIG. 2 is a perspective representation, in which substantially an outer casing 61 of the focusing lens 31 of the electron beam column 3, the gas supply arrangement 15 and the object 13 is schematically illustrated.

Figure 3:
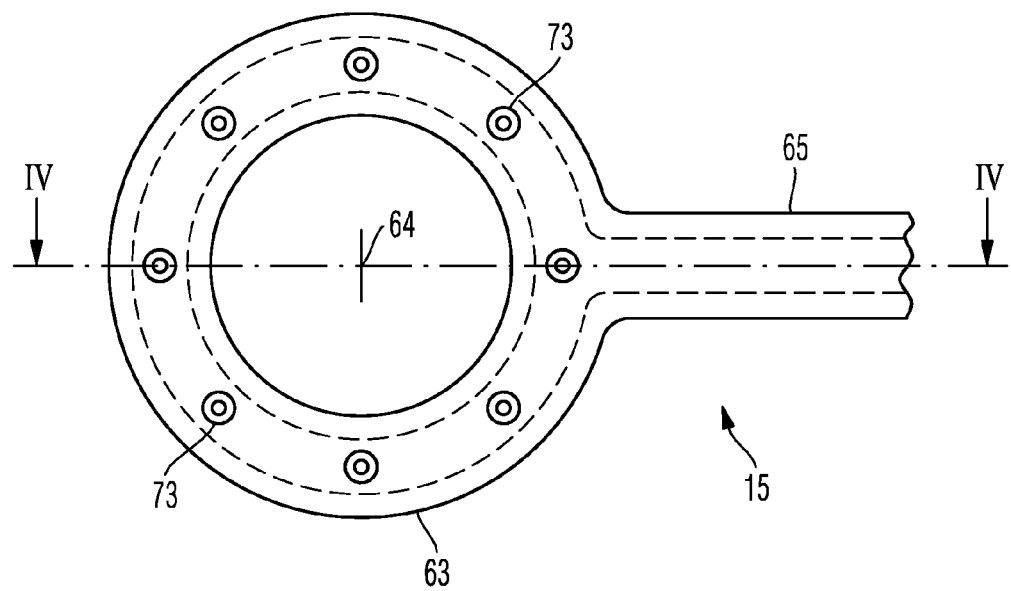
FIG. 3 is a plan view from bottom side showing the gas supply arrangement of the processing system illustrated in FIGS. 1 and 2.
Figure 4:
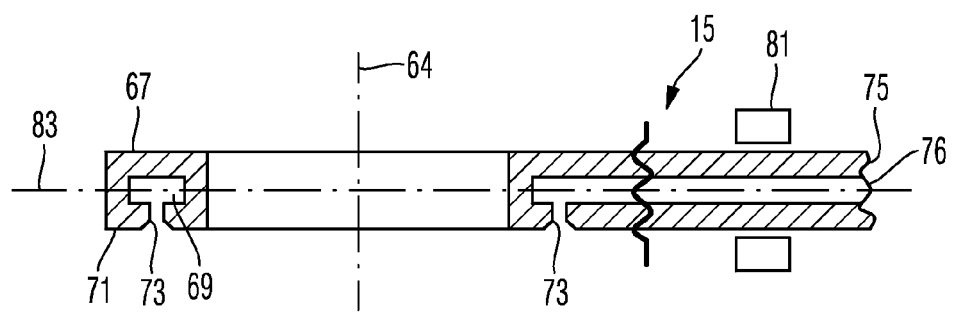
FIG. 4 is a cross section of the gas supply arrangement, illustrated in FIG. 3 along line IV-IV.

FIG. 3 is a plan view from bottom side onto a portion of the gas supply arrangement 15 and FIG. 4 is a cross sectional view of the portion of the gas supply arrangement 15, shown in FIG. 3, taken along line IV-IV in FIG. 3.

The gas supply arrangement 15 includes an annular piping 63, which extends as a torus about a symmetry axis 64 or optical axis of the focusing lens 31 and thereby also about the beam path of the electron beam 5. A gas supply line 65 includes a first end 66 which is connected via suitable lines 68 to a reservoir 74 containing a gas 71. Valves 72 or other devices such as heating or cooling devices are provided for controlling a flow of the gas 71 in the gas supply line 65. At the other end 75 of the gas supply line 65, the gas supply line 65 opens into the annular piping 63. The gas supply line 65 is connected with the annular piping 63 such that the annular piping 63 is supported and/or carried by the gas supply line 65. The annular piping 63 is rigidly connected to the gas supply line 65.

The annular piping 63 includes a pipewall 67 which defines a substantially closed channel 69. The pipewall 67 surrounds the axis 64. On a side 61 of the wall 67, which faces the object 13, the wall 67 includes a plurality of openings 73, which open into the channel 69. The gas supply line 65 includes a pipewall 75, which defines a channel 76, wherein the gas supply line 65 is connected to the annular piping such that the channel 76 opens into the annular channel 69. Thereby, gas 71 can be supplied from the reservoir 74 through the gas supply line 65 into the annular channel 69, and the gas exits to the interaction region via the exit openings 73. There, the gas acts according to its desired function, such as for example neutralization of charging on the surface of the object, removal of material from the object or deposition of material on the object.

The gas supply line 65 is pivotably or rotatably supported by a bearing 81 such that it is pivotable or rotatable about a longitudinal axis 83 of the gas supply line 65, as schematically illustrated in FIG. 4. Thereby, also the annular piping 63 is pivotable about the longitudinal axis 83.

The pivot axis 83 extends parallel to the tilt axis 53 of the object holder, such that the annular piping is pivotable together, synchronously and/or in correspondence with the object, in particular when the object is to be arranged at a different tilt position relative to the particle beam columns. In FIG. 1, there are illustrated two pivot positions of the annular piping 63. The unbroken lines illustrate a pivot position, in which the side 71 of the annular piping 63, which faces the object, is arranged parallel to the surface of the object 13, when the object is arranged in the tilt position, which is shown in unbroken lines. The dashed lines illustrate a pivot position, in which the side 71 of the annular piping 63 is arranged parallel to the surface of the object 13, when the object is arranged in the tilt position, which is illustrated in dashed lines.

Figure 5:
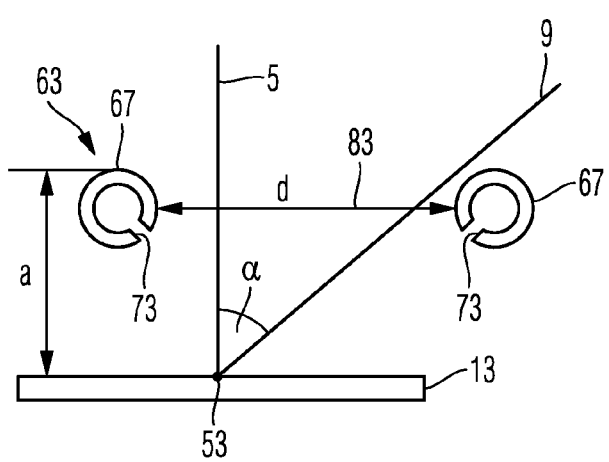
FIG. 5 is a cross section of the gas supply arrangement according to a further exemplary embodiment.

FIG. 5 shows, similarly as FIG. 4, a cross sectional representation of an exemplary embodiment of an annular piping for illustrating the underlying geometry and possible variants. The annular piping 63 extends around or surrounds an electron beam 5 and an ion beam 9. A principal plane of the ring piping 63 is oriented parallel to a surface of an object 13 to be processed. As shown in FIG. 5, the electron beam 5 is oriented parallel to a surface normal of the object 13, whereas the ion beam 9 is oriented at an angle α of 54° to the surface normal. Also in the exemplary embodiment, which is illustrated in FIG. 5, the object 13 is tiltable about a tilt axis 53, which is oriented perpendicular to the electron beam 5 and also perpendicular to the ion beam 9, whereas the annular piping 63 is tiltable or pivotable about a pivot axis 83, which is oriented parallel to the tilt axis 53.

In the configuration, which is shown in FIG. 5, the annular piping 63 is arranged at a distance a from the surface of the object 13, and an inner diameter d of the ring of the annular piping 63 is selected such that both beams 5 and 9 can traverse the ring and scan a common region on the surface of the object. Exemplary values for the distance a and the inner diameter d are: a=0.5 mm and d=1.2 mm; a=1.0 mm and d=2.5 mm; or a=2.0 mm and d=5.2 mm.

In the example, which is illustrated in FIG. 5, the annular piping 67 includes a circular cross section, whereas the cross section of the annular piping, which is shown in FIG. 4, is rectangular. Also, other different geometries for the cross section of the annular piping are conceivable.

Furthermore, openings 73 of the annular piping, which are shown in FIG. 5, are oriented at an angle of 54° to a principal plane of the ring, such that gas, which flows out from the annular piping 67 via the openings 73, is directed to the intersection of both particle beams 5 and 9. In the exemplary embodiment, which is illustrated in FIG. 4, the openings 73 of the annular piping are oriented at an angle of 90° relative to a principal plane of the ring, such that the outflowing gas is incident substantially perpendicular on the surface of the object. It is obvious, that the angle, at which the openings of the annular piping are oriented relative to the principal plane of the ring, may be varied for controlling the flow of the gas towards the impingement location of the particle beams on the object in order to meet predefined criterions.

Through the pivoting of the annular piping in correspondence or synchronously with the tilting of the object, it is possible to arrange the object particularly close to the particle beam columns and to tilt the object without risking a collision between the gas supply arrangement and the object. Thereby, an installation space for the annular piping is comparatively small. Furthermore, also the distance of the annular piping from the object is comparatively small, such that the process gas is emitted from the gas supply arrangement at a location close to the object and the process gas can be sufficiently supplied to the object. Furthermore, the constant orientation of the annular piping relative to the object, which is independent from the tilt position of the object relative to the focusing lens, results in a symmetrization of electric and magnetic fields, which are generated by the focusing lenses of the particle beam columns, such that the particle beams can be focused optimally onto the object, without being dependent from the tilt position of the object.

In the exemplary embodiments described above, a distance is provided between the tilt axis of the object holder and the pivot axis of the annular piping, which substantially corresponds to the distance between the surface of the object and the annular piping. However, it is also conceivable to provide different distances between the tilt axis of the object holder and the pivot axis of the annular piping, which are greater or smaller than the distance between the surface of the object and the annular piping. For example, the tilt axis of the object holder and the pivot axis of the annular piping may coincide or substantially coincide. Thereby, the object holder and the annular piping may be pivotable about a common axis. In other words, the pivot axis of the annular piping may be located on the tilt axis of the object holder.

It is also conceivable, that the annular piping of the gas supply arrangement is not arranged stationary in the region between the objective lens and the object holder, but is removable from this region and can be inserted when desired. To this end, the gas supply line of the gas supply arrangement may traverse a vacuum chamber wall of the processing system, such that by longitudinally moving and/or pivoting the gas supply line from outside of the vacuum chamber wall, the annular piping is positionable or removable from the region between the objective lens and the object holder.

In the exemplary embodiments described above, the processing system includes two particle beam columns, wherein one of which is configured as an electron beam column and the other is configured as an ion beam column. However, it is also conceivable, that third or a plurality of further particle beam columns are provided. It is further conceivable that two particle beam columns are provided, wherein both of which are configured as electron beam columns or ion beam columns. It is further conceivable that only one particle beam column is provided, which is either configured as an electron beam column or an ion beam column.

While the foregoing disclosure has been described with respect to certain exemplary embodiments thereof, it is evident that many alternatives, modifications and variations will be apparent to those skilled in the art. Accordingly, the exemplary embodiments set forth herein are intended to be illustrative and not limiting in any way. Various changes may be made without departing from the spirit and scope of the present disclosure as defined in the following claims.

What is claimed is:
1. A system, comprising:
a first particle beam column comprising a focusing lens configured to focus a first particle beam along a first beam path to an interaction region;
an object holder configured to arrange an object in the interaction region, the object holder being configured to tilt the object relative to the first particle beam column about a tilt axis transverse to a direction of the first beam path; and
a gas supply arrangement comprising a piping and a gas supply line,
wherein:
a first end of the gas supply line is coupleable to a gas reservoir;
a second end of the gas supply line opens into the piping so that the gas supply line is configured to supply gas from the gas reservoir to the piping;

the piping extends annularly around the first beam path between the focusing lens and the interaction region;

the piping has a plurality of openings on a side facing the interaction region so that gas exiting the openings is oriented towards the interaction region; and the piping comprises a holder configured to pivot the piping about a pivot axis parallel to the tilt axis.

2. The system of claim 1, wherein the gas supply line comprises a section extending linearly along the pivot axis.

3. The system of claim 1, wherein the piping is supported by the gas supply line.

4. The system of claim 1, wherein the openings are equally distributed along a circumferential direction of the piping.

5. The system of claim 1, wherein an inner diameter of the piping in a direction transverse to the pivot axis is greater than 0.1 mm.

6. The system of claim 1, wherein an inner diameter of the piping in a direction transverse to the pivot axis is greater than 0.5 mm.

7. The system of claim 1, wherein an inner diameter of the piping in a direction transverse to the pivot axis is less than 10.0 mm.

8. The system of claim 1, wherein an inner diameter of the piping in a direction transverse to the pivot axis is less than 5.0 mm.

9. The system of claim 1, wherein a distance between the tilt axis and a side of the piping which is averted from the object holder when the piping is oriented parallel to the object is greater than 0.5 mm.

10. The system of claim 1, wherein a distance between the tilt axis and a side of the piping which is averted from the object holder, when the piping is oriented parallel to the object is greater than 1.0 mm.

11. The system of claim 1, wherein a distance between the tilt axis and a side of the piping which is averted from the object holder, when the piping is oriented parallel to the object is less than 4.0 mm.

12. The system of claim 1, wherein a distance between the tilt axis and a side of the piping which is averted from the object holder when the piping is oriented parallel to the object is less than 2.0 mm.

13. The system of claim 1, wherein the first particle beam is an electron beam or an ion beam.

14. The system of claim 1, further comprising a second particle beam column having a focusing lens configured to direct a second particle beam along a second beam path to the interaction region, wherein the piping extends annularly around the second beam path between the focusing lens of the second particle beam column and the interaction region.

15. The system of claim 14, wherein a direction of the second beam path is perpendicular to the tilt axis.

16. The system of claim 14, wherein the second particle beam is an electron beam or an ion beam.

17. The system of claim 14, wherein the first particle beam is an electron beam, and the second particle is an ion beam.

18. The system of claim 1, wherein the piping extends in the form of a circular annular shape around the first beam path.

19. A system, comprising:
a first particle beam column comprising a focusing lens configured to focus a first particle beam along a first beam path to an interaction region of an object, the object being tiltable about a tilt axis transverse to a direction of the first beam path; and
a gas supply arrangement comprising a piping, wherein:
the piping extends annularly around the first beam path between the focusing lens and the interaction region;
the piping has a plurality of openings on a side facing the interaction region so that a gas exiting the openings is oriented towards the interaction region; and
the piping is pivotable about a pivot axis parallel to the tilt axis.

20. A system, comprising:
a first particle beam column comprising a focusing lens configured to focus a first particle beam along a first beam path to an interaction region an object, the object being tiltable about a tilt axis transverse to a direction of the first beam path;
a second particle beam column having a focusing lens configured to direct a second particle beam along a second beam path to the interaction region; and
a gas supply arrangement comprising a piping, wherein:
the piping extends annularly around the first beam path between the focusing lens and the interaction region;
the piping has a plurality of openings on a side facing the interaction region so that a gas exiting the openings is oriented towards the interaction region; and
the piping is pivotable about a pivot axis parallel to the tilt axis.

* * * * *

UNITED STATES PATENT AND TRADEMARK OFFICE
CERTIFICATE OF CORRECTION

PATENT NO. : 8,415,644 B2
APPLICATION NO. : 13/451734
DATED : April 9, 2013
INVENTOR(S) : Fabian Perez-Willard Page 1 of 1

It is certified that error appears in the above-identified patent and that said Letters Patent is hereby corrected as shown below:

In the Specification:

1.) Column 5, Line 9: delete "silan" and insert --silane--.

In the Claims:

2.) Column 10, Claim 20, Line 31: delete "region an" and insert --region of an--.

Signed and Sealed this
Twenty-ninth Day of October, 2013

Teresa Stanek Rea
*Deputy Director of the United States Patent and Trademark Office*